ELECTRIC SEMICONDUCTOR DEVICES

Filed Aug. 18, 1955 2 Sheets-Sheet 1

Inventor
A. C. SIM
BY [signature]
Attorney

Inventor
A. C. SIM
By R P Moore
Attorney

United States Patent Office 2,924,003

Patented Feb. 9, 1960

2,924,003

ELECTRIC SEMICONDUCTOR DEVICES

Alan Coudray Sim, London, England, assignor to International Standard Electric Corporation, New York, N.Y., a corporation of Delaware Application August 18, 1955, Serial No. 529,256

Claims priority, application Great Britain September 1, 1954

4 Claims. (Cl. 29—25.3)

This invention relates to an electrode system for a semiconductor device comprising a body of semiconductor material and a wire electrode applied to the surface of said body, and more particularly relates to a method of making such an electrode system. The present invention is a further development of the invention described and claimed in the application of C. F. Drake, Serial No. 457,747, filed September 22, 1954, now abandoned.

The specification just mentioned describes the effects produced by passing forming current between a pointed wire electrode and a semiconductor with which the electrode is in contact. It explains that below the electrode there is produced a molten region, which is surrounded by a further region of lattice disturbance due to the heating effect of the current. This will be explained more fully below, but it will be mentioned here that according to the methods described in the above-mentioned specification, the dimensions of the two regions are both determined together by the forming current and cannot be separately specified.

The object of the present invention is to extend the methods described in the above-mentioned application in order that the dimensions of the two regions may be independently controlled.

This object is achieved according to the invention by providing a method of making an electrode system for a semiconductor device comprising applying a pointed electrode to the surface of a semiconductor body and passing a forming current through the contact thus established, the material of the said electrode and the contact pressure between the electrode and the body being so chosen as to produce a predetermined area of contact, in which the magnitude of the said current is chosen to be sufficient to melt the semiconductor over a region of the body in the neighbourhood of the electrode point, and in which the said current is cut off before equilibrium of the distribution of thermally produced lattice disturbances in the semiconductor is reached.

The invention also provides a method of making an electrode system for a semiconductor device comprising applying a pointed electrode to the surface of a semiconductor body, the material of the said electrode and the contact pressure between the electrode and the body being so chosen as to provide a predetermined area of contact, and passing a forming current through the contact thus established, in which the amplitude and waveform of the forming current are selected in such manner that the semiconductor is melted over a first specified region in the neighbourhood of the electrode point, and also in such manner that over a second specified region surrounding the first specified region, lattice disturbances are thermally produced in the body, the extent of the second region being chosen independently of the extent of the first region.

The invention also provides a method of making an electrode system for a semiconductor device comprising applying a pointed wire electrode to the surface of a semiconductor body in such manner as to produce a predetermined area of contact, and passing a spike pulse of forming current through the contact, the amplitude of the spike pulse being sufficient to melt some of the semiconductor in the neighbourhood of the electrode point, and its duration being less than the time required for equilibrium of distribution of thermally produced lattice disturbances in the semiconductor to be reached.

The invention also provides a semiconductor device having an electrode system made according to any one of these methods.

The invention further provides a method of electroforming a semiconductor device which comprises a pointed electrode making contact with the surface of a semiconductor body, the said method including the step of passing a pulse of current through the contact, the amplitude of the said pulse being chosen to be sufficient to melt the semiconductor over a specified region near the point of the electrode, and the duration of the pulse being chosen to be less than the time required for equilibrium of the distribution of thermally produced lattice disturbances in the body to be reached.

The invention also provides a semiconductor device having an electrode system electroformed according to the last-mentioned method.

The invention will be described with reference to the accompanying drawings, in which.

Figure 4:
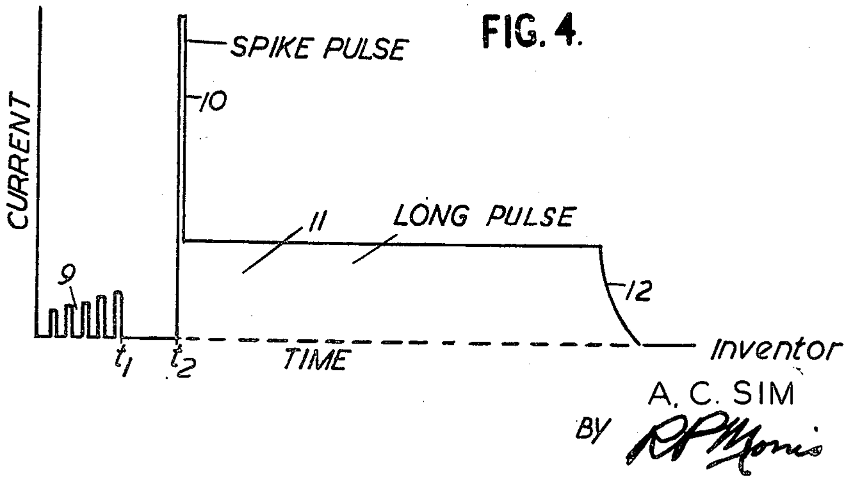
Figures 5, 6:
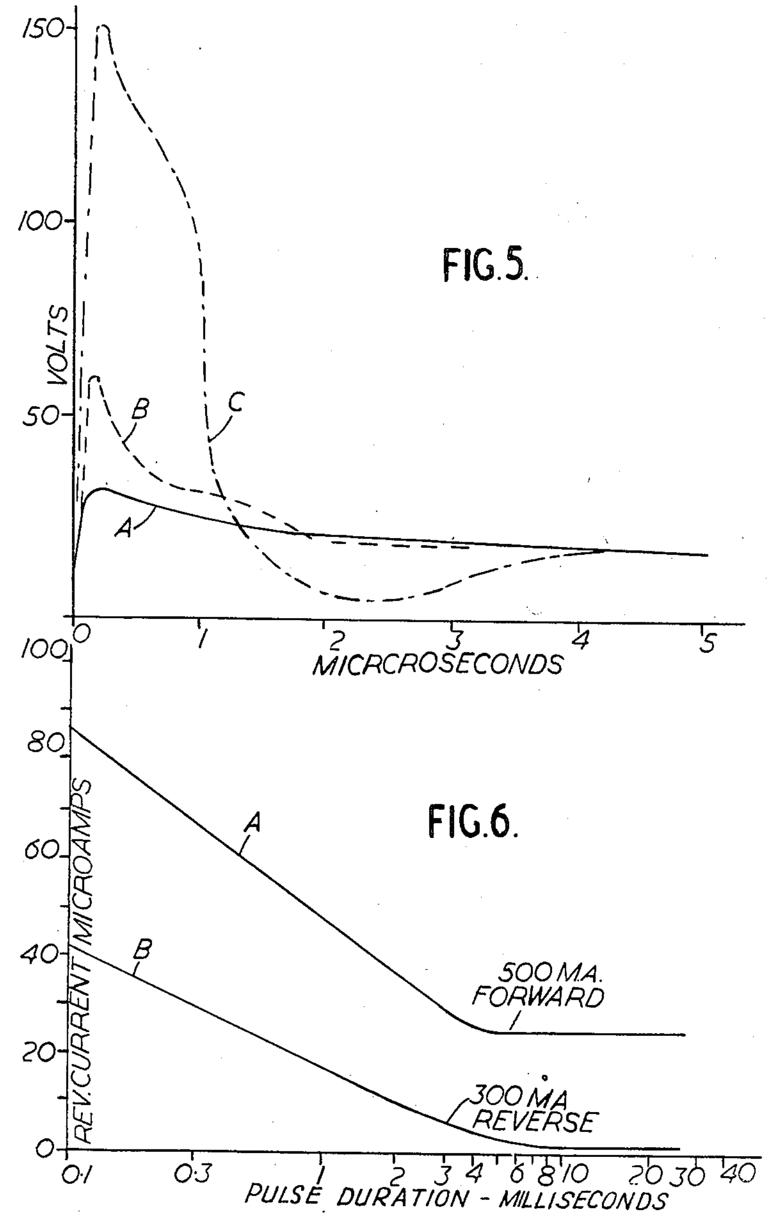

Fig. 4 shows a diagram of electroforming pulses to illustrate one process according to the invention; and Figs. 5 and 6 show curves used to assist in the understanding of the invention; Fig. 5 shows curves illustrating how equilibrium of temperature distribution is attained in the semiconductor, and Fig. 6 shows curves illustrating how equilibrium of the distribution of thermally produced lattice disturbances is attained.

In the present specification, the term "lattice disturbance" is used to mean a defect or irregularity in the crystal lattice of the semiconductor which either may be the seat of an easily detached electron or positive hole which can serve as a current carrier, or may act as a recombination centre or may otherwise change the properties of the material. Thermally produced lattice disturbances are those which result from appropriate heating of the semiconductor followed by quenching, and usually provide easily detachable positive holes which may convert the semiconductor to P-type conductivity; and it is believed that the presence of certain substances such as copper can greatly enhance such thermal conversion in the case of germanium. Thermal conversion is not caused by the presence of one of the usual acceptor significant impurities such as aluminium or gold, and may often be removed by appropriate annealing. A thermally produced lattice disturbance of this type is sometimes called a "thermal acceptor."

Figure 1:
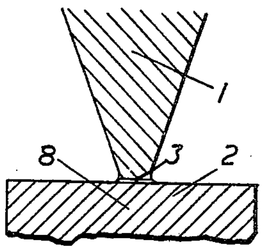
Fig. 1 shows to a large scale a section of an electrode system for a semiconductor device.

Referring to Fig. 1, when a pointed wire 1 is applied under pressure to the surface of a semi-conductor body 2, the point becomes more or less flattened as shown at 3.

If now a curent pulse be passed from the wire 1 through the area of contact 3 of the wire the semiconductor, the effect, if the current pulse be of sufficient amplitude and duration is three-fold:

(1) The material of the end of the wire, or of the semiconductor in its immediate neighbourhood, or both, are melted. If the material of the semiconductor alone becomes molten the wire material dissolves in it. In any case an alloy is formed between the wire material and that of the semiconductor;

(2) Thermal formation of lattice disturbances in the material of the semiconductor occurs beyond the region of the alloy; and (3) If the wire contains a significant impurity, that impurity passes into the alloy and into the semiconductor in the region immediately around the region of the alloy.

Figure 2:
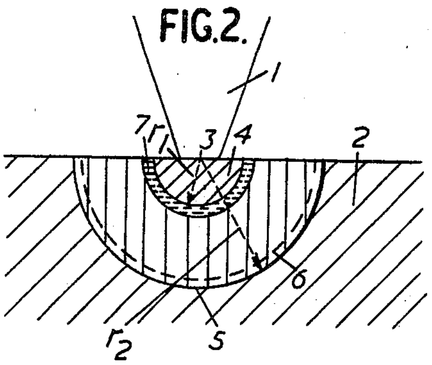
Fig. 2 shows to a large scale a sectional view of the electrode system illustrating the regions produced below the contact by electroforming.

Fig. 2 illustrates the resulting condition in the neighbourhood of the end of the wire 1.

The first effect mentioned above is to form a region 4 roughly hemispherical in shape which during the passage of current is molten. This region 4 contains both material from the wire 1 and from the semiconductor 2, the exact composition depending on the metallurgy (phase diagram) of the two component system. This region 4 becomes a conductor or a degenerate semiconductor. Beyond this region 4 the semiconductor is heated below its melting point with isothermals forming more or less hemispherical shells, the temperature distribution depending on the curent amplitude and contact area. It has been found that the radius of any given isothermal is directly proportional to the forming curent, assuming thermal equilibrium has been established.

When a semiconductor is heated, the lattice structure becomes increasingly disordered or disturbed as the temperature is raised. According to the invention of the above-mentioned application, the forming current is applied by means of a relatively long pulse with a rapid decay time, and the lattice disorder produced by the pulse is frozen in by the rapid cooling on cessation of the pulse and two effects are produced: (*a*) the lattice disturbances may act as centres with high minority current carrier generation and recombination rates and so the current carrier lifetime is reduced and (*b*) suitable disturbances act as acceptors, each producing one hole.

In the case of the semiconductor material 2 being N-type, such as N-type germanium, the material originally contains a net excess of donor impurities (producing electrons). Thus the thermally produced acceptors can partially or completely cancel the donors. If the thermal acceptors produced exceed in concentration the donors originally present, then conversion of the semiconductor to P-type occurs. The temperature necessary to convert an N-type semiconductor to a P-type is generally the higher, the greater the initial N-type conductivity.

The electrode system resulting from the passage of a pulse sufficient in amplitude and duration and having sufficiently rapid decay time, in the case of an N-type semiconductor and a wire containing a donor impurity, is shown on Fig. 2.

Changes in lattice structure will occur throughout a certain region bounded by a hemispherical isothermal shell 5 surrounding the region 4, and up to a particular isothermal shell 6 conversion from N-type to P-type will occur. The isothermal 6 then constitutes a P–N junction; beyond this the germanium is still N-type. Nevertheless changes have occurred beyond this junction, as shown in Fig. 2 by the fact that the shell 5 is outside the shell 6; the hole generation and recombination rates have been increased so that it is only at a distance beyond the junction 6, i.e., up to an isothermal corresponding to say, 300° C. in the case of germanium, that no appreciable effects are evident. The radius of the hemispherical shell 5 will be referred to hereinafter as $r_2$.

As already mentioned, it is believed that the presence of some substance (such as copper), not one of the usual significant impurities, may be necessary for thermal conversion of an N-type semiconductor to P-type. Differences in the effects of forward and reverse current in forming germanium and silicon have been found, and this may be due to the atoms of such a substance as copper behaving as charged ions and being transported in a direction dependent on the sense of the forming pulse.

If the material of the wire 1 contains a significant impurity, this impurity will be present in the region 4 consisting of an alloy of the wire material and the semiconductor material, and this significant impurity will travel into a substantially hemispherical region 7 surrounding the region 4, the transfer of the impurity occurring by diffusion, which is either aided or resisted by electrolytic conduction, depending upon the sense of the forming pulse. The distance at which the concentration falls to any given value depends upon the initial concentration in the material of the wire 1.

In the case of a donor impurity, an N–P junction will occur within the region 7 at such a distance from the point of the wire 1 that the concentration of the donor impurity derived from the wire 1 is equal to the concentration of the acceptors present in the region 7. The radius of the region 4 will be referred to hereinafter as $r_1$.

In the case of an N-type semiconductor with a wire 1 containing an acceptor impurity, the general conditions shown in Fig. 2 still apply but no junction will occur in the region 7, which will consist of high conductivity P-type semiconductor. The effect of the forming current is then to enhance the change of conductivity of the semiconductor with the amount of forward current passing, since when forward current passes (during subsequent normal operation of the device) this current is carried by holes passing across the junction 6 and thus the conductivity of the bulk of the N-type semiconductor is increased by the presence of these holes. Thus in these circumstances the effect of the forming current is to improve the forward conductivity of the electrode system without deteriorating the reverse characteristic.

In the case of a P-type semiconductor, the thermal conversion occurring within the shell 5 increases the P-type conductivity of the semiconductor and there is no junction corresponding to the boundary 6. The wire 1 must, in this case, contain an N-type impurity and one rectifying junction corresponding to 7 only exists. Such an electrode system is suitable for the emitter electrode system of a transistor, for example.

The above description with reference to Figs. 1 and 2 is taken from the specification of the application already referred to. The said specification also shows how the properties of the electrode system depend upon the relative magnitudes of $r_1$ and $r_2$, and how these relative magnitudes may be controlled by the amplitude of the forming current in order to produce with a high degree of reproducibility semiconductor devices having various desired characteristics.

It is therein shown that the amplitude of the forming current required depends, within certain limits, upon the contact area originally established between the wire electrode and the semiconductor (which contact area depends upon the relative hardness of the wire and of the semiconductor, and upon the contact pressure between the wire and the semiconductor), upon whether the semicondutor is of P- or N-type, upon whether the wire electrode contains a significant impurity, and upon the type (donor or acceptor) of said impurity.

In the making of an electrode system according to the invention described in the said specification, it was possible to control the difference between $r_2$ and $r_1$ but it was not possible to control either independently of the other. It is the chief object of the present invention to remove this restriction.

Figure 3:
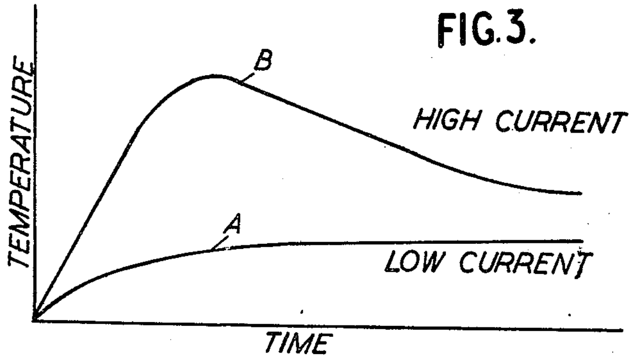
Fig. 3 shows curves illustrating the rise of temperature of an electrode system.

When a pulse of current between the wire electrode 1 and the semiconductor 2 (Fig. 1) is switched on, the temperature of a point such as 8 near the contact 3 begins to rise, and after a finite time, depending on the current amplitude, the contact area, and the thermal conductivities of the electrode and the semiconductor, a constant equilibrium temperature will be reached. For low values of forming current the rise to equilibrium temperature is continuous, but for higher values the temperature first rises above the equilibrium temperature and then falls, as shown in Fig. 3, curves A and B, respectively.

In the case of germanium devices, for a pulse of given amplitude, sufficient to produce a molten region, and of a duration of, say, 3 milliseconds, depending on the current amplitude, the regions shown in Fig. 2 are all completely established together and any further increase in the pulse duration has little effect. Below this duration the radius $r_2$ of the region of lattice disturbances is dependent not only on amplitude, but also on time. Below a much smaller duration, say 1 microsecond, the radius $r_1$ of the molten region is also time dependent.

According to the method of the present invention, a very short current pulse is passed through the contact 3 (Fig. 1) of sufficient amplitude and duration to produce a molten region over at least the whole area of contact. The duration of the pulse is, however, so short that equilibrium in the production of lattice disturbances is not reached. It may also be so short that equilibrium in the distribution of temperature has not been reached. This very short current pulse will be referred to as a "spike pulse" to distinguish it from the much longer forming pulses used according to the method of the specification already referred to, these pulses being so long that both kinds of equilibrium are reached. These points will be more fully explained later with reference to Figs. 5 and 6.

The upper limit of the amplitude of the spike pulse is set chiefly by the condition that the resulting electrode system shall be electrically and mechanically sound after forming.

It is desirable for maximum efficiency to supply energy to the system so rapidly that heat conduction is too slow to reduce the temperatures reached, which are then determined principally by the thermal capacity of the contact.

The peak temperature reached during the spike pulse depends to some extent upon the initial contact resistance. The importance of ensuring a predetermined contact area is pointed out in the above-mentioned prior specification. According to a subsidiary feature of the present invention, a small current may be passed through the contact 3 for stabilising or controlling the contact resistance, before the actual forming operation. The current, which may be a direct current, or a wave, or a train of pulses, is increased until the contact resistance stabilises at a predetermined value.

The spike pulse may be repeated, if necessary, depending on the application and the characteristics desired.

The use of the spike pulse according to the present invention is principally for the purpose of controlling the radius $r_1$ and composition of the molten region 4 (Fig. 2). When a thermal conversion region is also desired, its radius $r_2$ may be determined by the application of a suitable long forming pulse according to the method of the prior specification already referred to. The long forming pulse may be applied before or after the application of the spike pulse or pulses, or it may immediately follow a spike pulse.

Fig. 4 shows a graph of the succession of forming currents which may be used to produce an electrode system in some particular case. It is only intended as an illustrative example, and is not drawn to scale.

The process commences with the application of a train of short stabilising pulses 9 of small and increasing amplitude. These pulses may be 1 millisecond apart for example. At time $t_1$ the resistance of the contact is stabilised at the desired value and the pulses 9 are switched off. At time $t_2$ the spike pulse 10 is applied. This spike pulse may have a duration of 1 microsecond, and an amplitude of several amperes, for example. Immediately after the spike pulse 10 a long forming pulse 11 is applied, the amplitude and duration being of the order of several hundred milliamperes and 25 milliseconds, respectively, for example. The trailing edge 12 of the pulse 11 is shown curved exponentially so that the current is not cut off too suddenly. This prevents too rapid quenching. It will be understood that Fig. 4 is only one example of the process which may be applied: there may, for example, be an appreciable time interval between the pulses 10 and 11, or the pulse 10 may be applied after the pulse 11.

In order that the action of the spike may be clearly understood it is necessary to explain that the time taken for equilibrium in the distribution of lattice disturbances to be established is very much greater than the time required for equilibrium of temperature distribution. This is the reason why a very short spike pulse can be used without affecting appreciably the distribution of lattice disturbances. These phenomena are illustrated in Figs. 5 and 6. The full line curve A in Fig. 5 shows the relation between the voltage between the wire electrode and the semiconductor, and time, when a current of constant amplitude 400 milliamperes is continuously applied in the forward direction across the contact. The voltage rises steeply to about 30 volts at 0.1 microsecond, this rise being largely determined by the leading edge of the forming pulse. The region round the point of the wire becomes quickly heated and the temperature rises, which causes the resistivity of the heated region of the semiconductor to fall. The voltage across the contact thus starts to fall as indicated by curve A, and reaches 20 volts at about 1.5 microseconds. The reduction in voltage flattens out, until by about 5 microseconds it has reached a practically constant value of about 16 volts, which indicates that the temperature distribution has reached equilibrium.

The dashed curve B shows the results obtained when the 400 milliampere current is immediately preceded by a spike pulse of amplitude 1 ampere and duration 1 microsecond. The curve is of similar character to curve A, but the initial voltage maximum is now about 60 volts, and the final constant value of about 16 volts is more quickly reached due to the more rapid heating. It will be noted that the spike pulse ceases long before the equilibrium of temperature distribution has been reached.

The dash-dot curve C shows the effect of increasing the amplitude of the spike pulse to 2 amperes. The initial voltage maximum is about 150 volts, but it decays faster and falls below the final value, showing that the spike pulse has increased the size of the molten region for a short time.

Fig. 6 shows the effect of applying long forming pulses of increasing duration to an electrode system similar to that to which Fig. 5 relates. After the application of each forming pulse the reverse current at 30 volts was measured and is plotted in Fig. 6 as ordinate with reference to the corresponding forming pulse duration as abscissa.

Curves A and B in Fig. 6 show the results obtained using a long forming pulse of 500 milliamperes in the forward direction and 300 milliamperes in the reverse direction, respectively. A logarithmic time scale is used so that the form of the curves can be more easily appreciated. The curves show that the reverse current does not reach a minimum until the duration of the forming pulse is 10 milliseconds or more. The attaining of this minimum indicates that the distribution of lattice disturbances produced by the long forming pulses had reached equilibrium. Thus, comparing Figs. 5 and 6 it will be seen that the distribution of lattice disturbances takes something of the order of a thousand times as long to reach equilibrium, as the distribution of temperature. It will be clear from Fig. 6 that a spike pulse of duration of the order of 1 microsecond ceases long before equilibrium of the distribution of lattice disturbances is reached and can have little effect on this distribution. It can also be seen from Fig. 6 that increasing the duration of the long forming pulse beyond about 10 milliseconds produces no further effect, so that if a duration of say, 25 milliseconds is chosen, equilibrium of the distribution of the lattice disturbances will have been reached with a good margin, and the results obtained can be expected to be reproducible.

It should be pointed out that more than one spike pulse may be applied through the contact between the wire electrode and the semiconductor, according to the characteristics which it is desired to obtain. These spike pulses need not be all of the same amplitude or polarity. After the cessation of a spike pulse, the regions near the contact may take as long as 30 microseconds to cool when the amplitude of the spike pulses is large, and during that time a small region of lattice disturbances may be produced. This region will only extend a slight distance beyond the initial molten region 4 (Fig. 2) when the duration of the spike pulse is small compared with the equilibrium time of three or four milliseconds; for example the region of lattice disturbances might be similar to the region 7. One or more repetitions of the spike pulse serves to integrate the lattice disturbances. Thus by repeated application of the spike pulse a small significant region of lattice disturbances may be built up under proper control, independently of the molten region, without the use of the long forming pulse at all. Such a small region of lattice disturbances may be suitable for some devices, so that while the long forming pulse may often be required, its use is not essential to the present invention.

It has been verified by experiment that the radii $r_1$ and $r_2$ (Fig. 2) can be controlled independently. Thus, in the case of a collector electrode system for a transistor employing N-type germanium, in which the collector electrode was a pointed wire of silver-arsenic alloy, a long forming pulse of amplitude 300 milliamperes and duration 25 milliseconds was applied in the forward direction, thus producing a normal collector contact system according to established practice. Spike pulses were then applied in succession, also in the forward direction, allowing the contact to cool between adjacent pulses, their amplitude being gradually increased until the collector resistance was suddenly reduced to a low value. The reason for this reduction in resistance is that the spike pulses increased the radius $r_1$ of the region 4 (Fig. 2) until the inner N–P junction in the region 7 becomes so close to the outer P–N junction at 6 that electrons can pass through the narrow P-type region remaining without recombination. It was found that the collector resistance could then be restored to a normal high value by applying a long forming pulse of amplitude 500 milliamperes, which increased the radius $r_2$ of the thermally converted region, thus moving the outer P–N junction further away from the inner N–P junction. This clearly shows that $r_1$ and $r_2$ can be adjusted separately.

It has been found that a satisfactory collector electrode system for a transistor cannot always be made by the established forming methods when commercially produced Phosphor bronze wire is used for the collector electrode. This appears to be due to the erratic distribution of phosphorus in this wire. Some tests were made on a transistor using N-type germanium in which the emitter electrode consisted of a wire of platinum-ruthenium alloy, and the collector electrode was made from a length of Phosphor bronze wire deficient in phosphorus, the spacing between the points of the electrodes being 0.001 inch. When long forward forming pulses ranging in amplitude between 150 milliamperes and 1.5 amperes were applied to the collector contact, no sign of transistor action could be obtained. No succcess was obtained by repeatedly applying a long forming pulse of amplitude 500 milliamperes and duration 10 milliseconds. It seemed probable that the failure was due to the fact that the wire contained insufficient phosphorus to produce the required inner N-type region by the ordinary forming process. It was expected, however, that if the phosphorus deficiency were not too great, the application of a spike pulse should remedy the trouble by momentarily melting a larger volume of the collector electrode wire than is possible with the long forming pulse, thereby introducing more phosphorus, without seriously affecting the region of lattice disturbance produced by the long pulse. Spike pulses of amplitude 5 amperes and duration 1 microsecond, and spaced sufficiently to allow the contact to cool between successive pulses, were accordingly applied in the forward direction to the collector contact; and the current gain of the transistor was measured after the application of various numbers of spike pulses as indicated by the following table. Some transistor action was obtained after the application of only one spike pulse:

| No. of Spike Pulses | 1 | 3 | 5 | 24 | 44 | 64 | 104 |
|---|---|---|---|---|---|---|---|
| Current gain | 0.5 | 1.0 | 1.5 | 1.6 | 1.8 | 2.2 | 2.9 |

After the transistor was suitably mounted the current gain was found to be maintained at 2.8 when the collector bias voltage was between 7 and 28 volts, at which latter value it became overloaded.

A spike pulse may also be used to restore the collector electrode system of a transistor which has been rendered useless by the application of a normal long forming pulse of excessive amplitude. Thus in one case it was found that after the application of a long forming pulse of amplitude 1.5 amperes and duration 10 milliseconds, the collector contact was spoilt: but the subsequent application of a spike pulse of amplitude 15 amperes and duration 1 microsecond restored the transistor action and a current gain of 3 was reached.

It should also be noted that the present invention can result in the production of devices which will not be so seriously disturbed in performance by high current surges which are sometimes encountered during operation. This is because the spike pulses are themselves large current surges used in the forming treatment.

By means of the present invention it is also possible to produce rectifiers from electrode systems not previously capable of giving useful results, or to produce improved rectifiers treated by other forming methods. For example, diodes may be produced from N-type germanium of 0.4 ohm cm. specific resistance with a carefully ground and etched surface, and a pointed duralumin wire of contact area 0.005 inch diameter by applying 1 microsecond spike pulses of amplitude 0.75 ampere in the forward direction. Diodes so formed have a reverse resistance of 25 megohms at −12 volts and pass 70 milliamperes at +1 volt. The maximum reverse working voltage is about 20 volts. In another example, diodes were produced from P-type germanium with characteristics which compare favourably with those made from N-type germanium.

The figures for durations and amplitude of pulses given above have been for germanium. The invention is also applicable to other semiconductor materials. For example, using P-type silicon with a wire electrode of silver containing 0.1% of arsenic or phosphorus, rectifiers have been produced by applying a spike pulse of amplitude 0.5 ampere and 1 microsecond duration. These had a reverse resistance of 10 megohms at +12 volts and passed a forward current of 2 milliamperes at −2 volts. By using a silver electrode plated with bismuth the same spike pulse produced rectifiers having a lower reverse resistance but higher forward current.

It has been mentioned above with reference to Fig. 3 that in the case of a forming pulse greater in amplitude than a certain minimum the temperature at the contact may, shortly after switching on, rise above the thermal equilibrium temperature. This rise may be of value, if the melting point of the wire electrode is higher than that of the semiconductor, in enhancing the injection of significant impurities from the wire into the semiconductor, and the effect may be increased by immediately preceding the long forming pulse by a spike pulse without any time interval between as shown for example in Fig. 4. On the other hand, it may be desired to reduce the excessive rise of temperature to minimise the melting of the wire electrode, in which case no spike pulse is used, and the initial rate of increase of the forming current may be reduced by suitably shaping the leading edge of the long forming pulse.

Dislocations leading to the formation of a small region of lattice defects around the molten region may occur during the rapid cooling after cessation of a long forming pulse. Such dislocations may be reduced in density by switching off the pulse at such a rate that thermal equilibrium may be supposed to exist at any time and yet fast enough to ensure that the duration of the pulse is not appreciably increased. This is indicated by the curved trailing edge 12 of the long forming pulse 11 shown in Fig. 4. In the case of germanium a suitable duration for the trailing edge 12 may be 2 milliseconds for example. The reduction of the density of the dislocations is useful in reducing the electrical noise of the finished device.

While one effect of the spike pulse is to drive material (which may include significant impurities) from the wire into a region around the initial contact between the wire and the semiconductor, a spike pulse may also be used with a wire electrode which does not melt and/or does not contain significant impurities, if useful changes can be produced by melting and cooling a region of the semiconductor.

While the principles of the invention have been described above in connection with specific embodiments, and particular modifications thereof, it is to be clearly understood that this description is made only by way of example and not as a limitation on the scope of the invention.

What I claim is:

1. A method of welding a point contact electrode to a semiconductor body, and for independently controlling the molten and disturbed lattice regions underlying the electrode, comprising positioning the electrode on said semiconductor body, applying pressure between the contacting electrode and said body, applying a spike shaped forming current pulse having sufficient magnitude to melt a first region of the semiconductor underlying the contact and to produce lattice disturbances in a second region surrounding said first region, said current pulse being of such duration that the current is terminated before equilibrium of the distribution of the lattice disturbance is reached, and adjusting the waveform of the current to produce a relatively long forming pulse of reduced magnitude, the magnitude being sufficient to cause thermal conversion but insufficient to melt the semiconductor, and the duration being sufficient to permit lattice disturbance equilibrium to be attained in the second region.

2. A method, according to claim 1, further comprising the steps of passing a plurality of current pulses through the contact.

3. A method, according to claim 1, in which the step of passing the said long forming pulse immediately follows the step of passing the spike pulse without any appreciable time interval.

4. A method, according to claim 1 and further comprising shaping the trailing edge of the long forming pulse so as to reduce the forming current to zero within a given period, the period being sufficient to prevent excessive quenching of the semiconductor.

References Cited in the file of this patent

UNITED STATES PATENTS

| | | |
|---|---|---|
| 2,704,818 | North | Mar. 22, 1955 |
| 2,713,132 | Matthews et al. | July 12, 1955 |
| 2,793,332 | Alexander et al. | May 21, 1957 |